United States Patent [19]

Heytmeijer

[11] 4,240,786
[45] Dec. 23, 1980

[54] SWITCHING DEVICES FOR A FLASH LAMP ARRAY AND METHOD

[75] Inventor: Herman R. Heytmeijer, Hanover Township, Morris County, N.J.

[73] Assignee: Westinghouse Electric Corp., Pittsburgh, Pa.

[21] Appl. No.: 913,777

[22] Filed: Jun. 8, 1978

[51] Int. Cl.³ ............................................. F21K 5/00
[52] U.S. Cl. .................................... 431/359; 362/15
[58] Field of Search ................. 431/359; 362/4, 6, 11, 362/13-15

[56] References Cited

U.S. PATENT DOCUMENTS

| | | | |
|---|---|---|---|
| 3,951,582 | 4/1976 | Holub et al. | 431/359 |
| 3,969,065 | 7/1976 | Smialek | 431/359 |
| 3,969,066 | 7/1976 | Smialek et al. | 431/359 |
| 3,988,647 | 10/1976 | Bolon et al. | 431/359 |
| 3,990,832 | 11/1976 | Smialek | 431/359 |
| 3,990,833 | 11/1976 | Holub et al. | 431/359 |
| 4,080,155 | 3/1978 | Sterling | 431/359 |

Primary Examiner—Carroll B. Dority, Jr.
Attorney, Agent, or Firm—R. S. Lombard

[57] ABSTRACT

A flash lamp array is disclosed including a plurality of flash lamps and a two-sided circuit board having sequencing circuitry affixed to one side thereof and having the lamps connected thereto to fire individually and in sequence. The array comprises solid-state thermally activated switches located externally of the lamp and affixed to one side of the circuit board forming a part of the sequencing circuitry. Each of the switches is located in close proximity to one of the flash lamps to receive thermal energy emitted by the proximate flash lamp upon its being fired, and thereby changes from a high resistance or non-conductive state to a low resistance or conductive state. The switches comprise a uniform mixture of predetermined proportions of finely divided silver carbonate, finely divided silver oxide and finely divided hydrophobic silica. Switches prepared from this mixture are reliable and have no tendency to crack. The mixture is easy to work with being very free flowing. The mixture is adhered to the circuit board as a unitary mass of predetermined dimensions by means of an organic polymer binder.

9 Claims, 3 Drawing Figures

SWITCHING DEVICES FOR A FLASH LAMP ARRAY AND METHOD

BACKGROUND OF THE INVENTION

This invention relates to flash lamp arrays and, more particularly, to a flash lamp array having solid-state thermally activated switches and method for making the same. Many flash lamp arrays utilizing thermally activated switches for sequentially firing flash lamps have been disclosed in recent years. One such array is disclosed in U.S. Pat. No. 3,990,833, dated Nov. 9, 1976, and issued to Holub et al. The Holub patent discloses a flash lamp array that utilizes solid-state radiant energy switching devices as part of the electrical circuit for sequentially firing the flash lamps. Each device is located adjacent one of the lamps to receive radiant energy emitted by the lamp, the device being a mass of the composition preferably comprising silver oxide, a carbon-containing silver salt and humidity resistant organic polymer binder. The switch initially has a relatively high resistance and, after undergoing thermal chemical change upon the flashing of a lamp, it has a relatively low electrical resistance. Although the Holub device normally works well, problems may be encountered due to incomplete conversion and cracking of the silver salt during the drying operation when the switch devices are applied to a circuit board.

SUMMARY OF THE INVENTION

The present improvement is provided in combination with a flash lamp array including plurality of flash lamps each having a vitreous envelope hermetically sealed to a pair of lead-in wires. The array further includes a two-sided circuit board having sequencing circuitry affixed to one side thereof. The lamps are connected to the circuit board to fire individually and in sequence.

The improvement comprises solid-state, thermally activated switches located externally of the lamps affixed to the one side of the circuit board, and a method for making the switches. The switches form a part of the sequencing circuitry with each of the switches located in close proximity to one of the flash lamps to receive thermal energy emitted by the one flash lamp upon its being fired to change from a non-conductive state to a conductive state. The switches comprise a uniform mixture of predetermined proportions of finely divided silver carbonate, finely divided silver oxide and finely divided hydrophobic silica. The mixture is adhered as a unitary mass of predetermined dimensions to the circuit board by means of an organic polymer binder. The mixture preferably contains finely divided silver carbonate in an amount of from about 70 to 99.6 wt. percent of the mixture, finely divided silver oxide in an amount of from about 0.1 to 30 wt. percent of the mixture and finely divided hydrophobic silica in an amount of from about 0.3 to 1.5 wt. percent of the mixture. These switches provide consistently reliable conversion and have no tendency to crack.

BRIEF DESCRIPTION OF THE DRAWINGS

For a better understanding of the invention, reference may be had to the exemplary embodiment shown in the accompanying drawings in which.

DESCRIPTION OF THE PREFERRED EMBODIMENT

Figures 1, 2, 3:
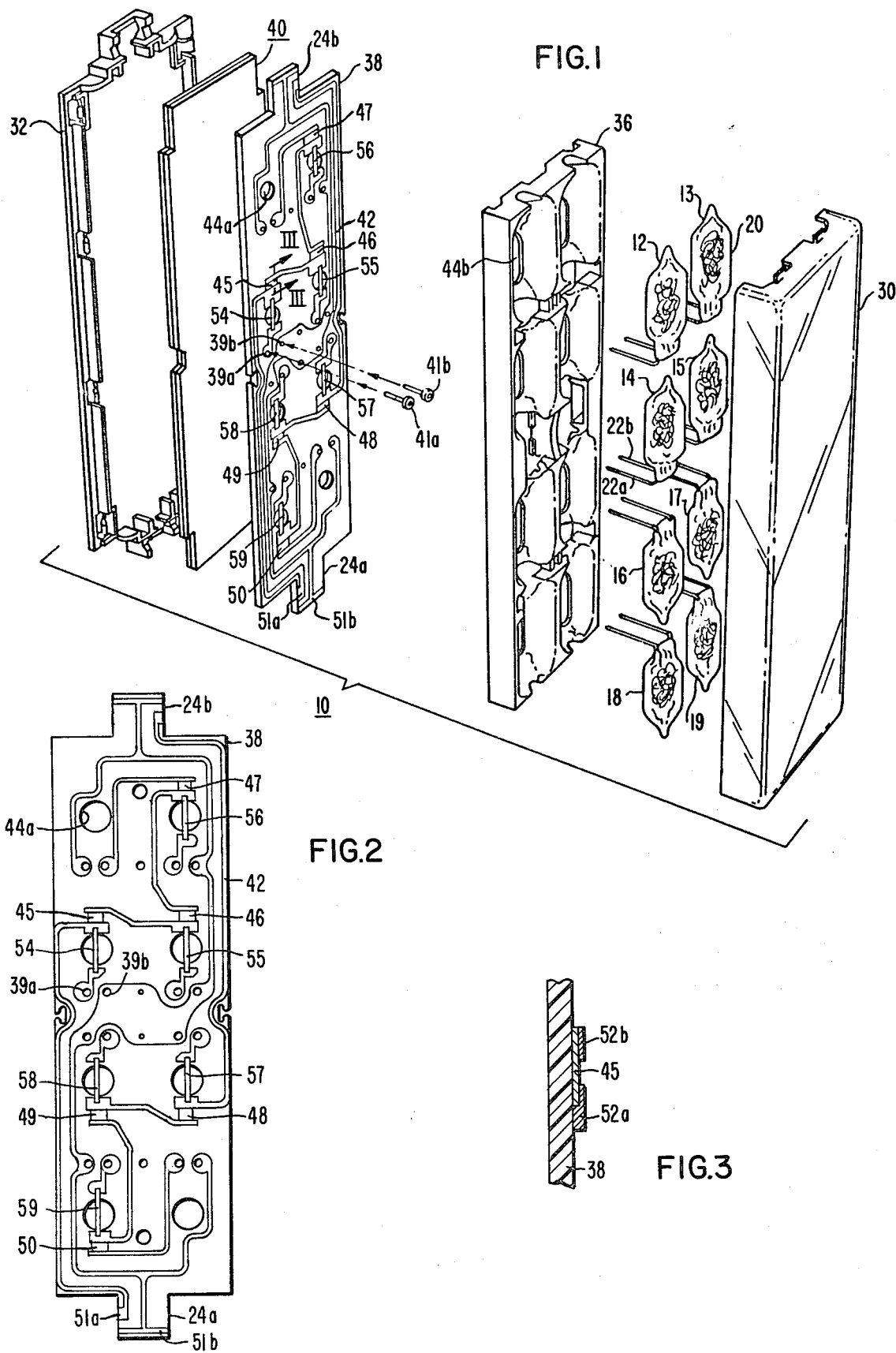
FIG. 1 is an exploded isometric view of a typical flash lamp array showing the internal parts.
FIG. 2 is a plan view of a circuit board showing the electrical circuitry, including the thermally activated switches.
FIG. 3 is a cross-sectional view taken on the line III—III of FIG. 2.

FIG. 1 shows a typical flash lamp array 10 including a plurality of electrically fired flash lamps 12–19 each having a tubular-shaped vitreous envelope 20 hermetically sealed to a pair of lead-in wires 22a, 22b. The lamp array 10 is provided with a plug-in connector tab 24a at the lower side or end thereof, adapted to be mountable in a socket of a camera or flash adapter. The lamp array 10 is also provided with a second plug-in connector tab 24b at the upper side or end thereof, whereby the array 10 can be mounted in a camera socket or flash adapter by either tab 24a or 24b to fire all of the lamps, as is conventional in such a design. The array 10 comprises an upper group of flash lamps 12, 13, 14, 15 and a lower group of flash lamps 16, 17, 18, 19, the lamps being arranged in a planar configuration. When the array is mounted in a camera socket by the tab 24a, only the upper group of the lamps will be flashed; likewise, when the array is mounted in a camera socket by tab 24b, only the lower group (now in the uppermost position) will be flashed. With this arrangement having only the lamps relatively far from the lamp's axis being flashable, the undesirable "red eye" effect will be reduced, as is well known in the art. The array also includes a front cover 30 for covering the flash lamps which is normally made of impact resistant color corrected plastic such as butadiene-styrene plastic, and a rear cover member 32 which is normally made of transparent plastic such as polystyrene. The front cover member 30 and the rear cover member 32 are affixed to one another by any suitable means, such as, with suitable adhesive. Between the front cover member 30 and the rear cover member 32, in the following order, are the flash lamps 12–19, reflector member 36 for reflecting light from the flash lamps toward the front cover member 30, a two-sided circuit board 38 provided with the integral connecting tabs 24a, 24b, and a flash sensing indicator means 40.

The two-sided circuit board 38 has affixed to one side thereof nearest the reflector member 36 sequencing circuitry 42 having lead-in wires 22a, 22b connected in circuit therewith for automatically flashing the lamps in each group in a predetermined sequence. The lamps 12–19 are positioned in close proximity to the one side of the circuit board 38. The circuit board 38 is provided with windows 44a therethrough, each in alignment with one of the lamps 12–19 to permit the passage of radiant energy upon the flashing of each of the aligned lamps. The lead-in wires 22a, 22b may be electrically connected to the sequencing circuitry 42 by any suitable means, such as, providing the circuit board 38 with holes 39a, 39b into which metallic eyelets 41a, 41b are inserted. The lead-in wires 22a, 22b are of sufficient length to extend through the eyelets 41a, 41b. The eyelets are then crimped thereby electrically connecting the lead-in wires 22a, 22b to the sequencing circuitry 42. The reflector 36 also has openings 44b provided therein in alignment with the windows 44a and the lamps 12–19. Preferably the flash sensing indicator 40 is in close proximity to the other side of the circuit board 38 and is readily observable by an operator of the flash array 10 through the transparent plastic rear cover member 32. The flash sensing indicator 40 indicates to the operator which lamps have been flashed.

In FIG. 2 is shown the one side of the circuit board 38 having sequencing circuitry 42 printed thereon, and forming a part of the sequencing circuitry 42 are solid-state thermally activated switches 45–50. Each of the switches is located in close proximity to one of the flash lamps to receive thermal energy emitted by the proximate flash lamp upon its being fired and changes from a nonconductive or high resistance state to a conductive or low resistance state. The switches comprise a uniform mixture of predetermined proportions of finely divided silver carbonate with an average particle size of about 1.0 to 2.5 microns, finely divided silver oxide with an average particle size of about 1.0 to 3.0 microns (as measured with an air-permeability type device such as the "Fisher Sub-Sieve Sizer" marketed by the Fisher Scientific Co.) and finely divided hydrophobic silica having a nominal particle size on the order of 0.007 micron. The mixture is adhered as a unitary mass of predetermined dimensions, for example, ⅛ in. × ⅛ in. (3.2 mm × 3.2 mm), to the circuit board by means of an organic polymer binder. It has been found that switches made of finely divided material of the following predetermined proportions work well: silver carbonate from about 70 to 99.6 wt. percent of the mixture; silver oxide from about 0.1 to 30 wt. percent of the mixture and hydrophobic silica from about 0.3 to 1.5 wt. percent of the mixture. Switches composed of finely divided silver carbonate as 79.25 wt. percent of the mixture, finely divided silver oxide as 20 wt. percent of the mixture and finely divided hydrophobic silica as 0.75 wt. percent of the mixture performed the best of the switches tested in the foregoing ranges of predetermined proportions of mixture material. Various organic polymer binders were tested and it was found that polystyrene works well having no tendency to react with silver oxide. Preferably the organic polymer binder comprises polystyrene dissolved in a readily vaporizable ester such as ethylene glycol monoethyl ether acetate vehicle for purposes of application. The ratio by weight of the binder to the mixture in the switches should be from about 1:40 to 1:3. When polystyrene is used as the binder, the preferred ratio by weight of polystyrene to the mixture in the switches is about 1:10.

The thermally-activated solid-state switches 45–50 for use in the flash lamp array 10 are made as follows: a mixture comprising silver carbonate and silver oxide together with hydrophobic silica is reduced to very finely divided and homogeneous status in a milling medium such as, a ball mill to form a finely divided, intimately mixed and free-flowing powder; the free-flowing powder is separated from the milling medium by screening for example; the separated free-flowing powder is mixed together in a suspending medium comprising an organic polymer binder preferably comprising a polystyrene resin and a solvent comprising a readily vaporizable ester such as ethylene glycol monoethyl ether acetate, as hereinbefore mentioned, to produce ink suitable for applying the switches; the ink is applied to a substratum by silk screening and the solvent is vaporized to form the solid state switches. To slow down the drying rate of the switch ink, part or all of the ethylene glycol monoethyl ether acetate may be replaced with ethylene glycol monobutyl ether acetate and/or diethylene glycol monobutyl ether acetate.

EXAMPLE

A. Milling of the Silver Salts

1. A one gallon ball mill containing 4,000 gms. of ¼" diameter glass balls is charged with,
   Silver carbonate: 1400 gms.
   Silver oxide: 350 gms.
   Tullanox 500[1]: 13.0 gms.

[1]trade designation for hydrophobic silica available from Tulco, Inc., North Billerica, Mass. After three hours of milling, the contents are discharged and, the milled powder is separated by screening out the grinding medium.

B. Preparation of the Ink

1. A 25 percent polystyrene resin solution is prepared by dissolving 250 gms. of Styron 685, a trade designation of the Dow Chemical Company, per 750 gms. of ethylene glycol monoethyl ether acetate.

2. One hundred-forty gms. of resin solution is weighed and placed into an 8 oz. (200 cc) jar and 370 gm. of milled silver salts is mixed in using a propeller stirrer (a paint shaker or similar device may also be used). The finished ink will have a viscosity of about 44,000 cps.

3. The ink is placed on the circuit board 38 or substratum by silk screening and the solvent is vaporized using a circulating air belt drier at a temperature of about 70° C. for about 10 minutes to form the switches 45–50.

Without the hydrophobic silica, the silver carbonate and silver oxide could not be dry milled because of their tendency to build up on the walls of the mill making mixing and milling impossible. Although wet milling is possible for grinding the silver salts as is well known in the art, it requires subsequent separation of the carbonate/oxide from the liquid and drying. Ultimately, it produces a non-free flowing powder which requires special equipment for dispersal in vehicle. By the present invention, the milled powder is dry and very free-flowing which permits the very simple and quick method herein disclosed for preparing the switch ink and does not require expensive equipment. In addition, without the hydrophobic silica the switch ink would be coarse textured giving silk screening deposits that would tend to crack during drying, producing unreliable switches.

With the array 10 mounted in a camera socket using tab 24a, the array functions as follows: when the operator of the camera actuates the shutter, a voltage is applied across circuit branches 51a, 51b, the voltage because of the design of the circuitry 42 is first applied to flash lamp 14 through lead-in conductors 22a, 22b. Immediately before the activation of the shutter, the switches 45–50 are all in the non-conductive or high resistance state. Upon the flashing of lamp 14, the switch 45 will receive radiation from the proximate lamp thereby changing from a non-conductive to a conductive state between its switch terminals 52a, 52b on the circuit board 38 shown in FIG. 3. Accordingly, upon the flashing of lamp 14, switch 45 becomes conductive. Preferably included in the sequencing circuitry are metallic fuses 54–59 which upon the flashing of a lamp burn through thereby insuring that each flashed lamp will be disconnected from sequencing circuitry 42. As switch 45 becomes conductive, the fuse 54 burns through, and the flash indicator 40 indicates to the operator that a lamp has been flashed. Upon the next actuation of the shutter by the operator, lamp 15 is caused to fire because of switch 45 becoming conductive and the process is repeated as hereinbefore explained until lamp 12 is fired at which time the array should be turned end over end with tab 24b being mounted in the camera socket and lamps 16-19 are ready to be flashed in the same sequential manner.

What we claim is:

1. In combination with a flash lamp array including a plurality of flash lamps each having a vitreous envelope hermetically sealed to a pair of lead-in wires, a two-sided circuit board having sequencing circuitry affixed to one side thereof and having said lamps connected thereto to fire individually and in sequence, the improvement which comprises:

solid-state thermally activated switches located externally of said lamps affixed to said one side of said circuit board and forming a part of said sequencing circuitry, each of said switches located in close proximity to one of said flash lamps to receive thermal energy emitted by said proximate flash lamp upon its being fired and change from a nonconductive state to a conductive state, said switches comprising a uniform mixture of predetermined proportions of finely divided silver carbonate, finely divided silver oxide, and finely divided hydrophobic silica, and said mixture adhered as a unitary mass of predetermined dimensions to said circuit board by means of an organic polymer binder.

2. The array of claim 1, wherein said finely divided silver carbonate is from about 70 to 99.6 wt. percent of said mixture, said finely divided silver oxide is from about 0.1 to 30 wt. percent of said mixture and said finely divided hydrophobic silica is from about 0.3 to 1.5 wt. percent of said mixture.

3. The array of claim 1, wherein said finely divided silver carbonate is 79.25 wt. percent of said mixture, said silver carbonate is 20 wt. percent of said mixture and said hydrophobic silica is 0.75 wt. percent of said mixture.

4. The array of claim 1, wherein said organic polymer binder comprises polystyrene.

5. The array of claim 1, wherein said finely divided silver carbonate has an average particle size of about 1.0 to 2.0 microns.

6. The array of claim 1, wherein said finely divided silver oxide has an average particle size of about 1.0 to 3.0 microns.

7. The array of claim 1, wherein said finely divided hydrophobic silica has a nominal particle size on the order of 0.007 microns.

8. The array of claim 1, wherein the ratio by weight of said binder to said mixture in said switches is from about 1:40 to 1:3.

9. The array of claim 4, wherein the ratio by weight of said polystyrene to said mixture in said switches is about 1:10.

* * * * *